(12) United States Patent
Julien-Roux et al.

(10) Patent No.: US 8,587,941 B2
(45) Date of Patent: Nov. 19, 2013

(54) COMPUTER BAY COOLING DEVICE AND COMPUTER EQUIPMENT COMPRISING SAME

(75) Inventors: Audrey Julien-Roux, Poissy (FR); Lionel Coutancier, Croisilles (FR); Thierry Fromont, Massy (FR)

(73) Assignee: Bull SAS, Les Clayes Sous Bois (FR)

( * ) Notice: Subject to any disclaimer, the term of this patent is extended or adjusted under 35 U.S.C. 154(b) by 125 days.

(21) Appl. No.: 12/995,461

(22) PCT Filed: May 28, 2009

(86) PCT No.: PCT/FR2009/050998
§ 371 (c)(1),
(2), (4) Date: Nov. 30, 2010

(87) PCT Pub. No.: WO2009/156647
PCT Pub. Date: Dec. 30, 2009

(65) Prior Publication Data
US 2011/0103009 A1 May 5, 2011

(30) Foreign Application Priority Data

Jun. 2, 2008 (FR) ...................................... 08 03013

(51) Int. Cl.
*H05K 7/20* (2006.01)
(52) U.S. Cl.
USPC .................. 361/679.48; 361/679.53; 361/688; 361/689; 361/698; 361/699; 165/80.2; 165/80.4; 165/104.33; 165/185; 62/259.2; 454/184
(58) Field of Classification Search
USPC ........................ 361/679.46–679.53, 688, 689, 361/690–696, 698–701, 724–728; 454/184; 165/80.2, 80.3, 80.4, 80.5, 165, 185, 165/104.33, 104.34, 121–126; 62/259.2; 312/223.1, 223.2, 230, 236
See application file for complete search history.

(56) References Cited

U.S. PATENT DOCUMENTS

| | | | |
|---|---|---|---|
| 6,579,168 B1 * | 6/2003 | Webster et al. | 454/184 |
| 6,819,563 B1 * | 11/2004 | Chu et al. | 361/696 |
| 7,619,887 B2 * | 11/2009 | Koch et al. | 361/696 |
| 7,660,116 B2 * | 2/2010 | Claassen et al. | 361/696 |
| 7,660,121 B2 * | 2/2010 | Campbell et al. | 361/698 |
| 7,950,244 B2 * | 5/2011 | Iyengar et al. | 62/259.2 |
| 8,120,916 B2 * | 2/2012 | Schmidt et al. | 361/700 |
| 8,210,914 B2 * | 7/2012 | McMahan et al. | 454/184 |
| 8,250,877 B2 * | 8/2012 | Correa et al. | 62/259.2 |
| 2001/0042616 A1 | 11/2001 | Baer | |
| 2004/0100770 A1 | 5/2004 | Chu et al. | |
| 2005/0061013 A1 * | 3/2005 | Bond | 62/259.2 |
| 2005/0170770 A1 * | 8/2005 | Johnson et al. | 454/184 |
| 2006/0232945 A1 | 10/2006 | Chu et al. | |
| 2007/0171613 A1 * | 7/2007 | McMahan et al. | 361/695 |
| 2008/0112128 A1 * | 5/2008 | Holland | 361/687 |
| 2008/0285228 A1 * | 11/2008 | Koch et al. | 361/687 |

(Continued)

*Primary Examiner* — Michail V Datskovskiy
(74) *Attorney, Agent, or Firm* — Miles & Stockbridge P.C.

(57) ABSTRACT

A cooling device of a computer rack equipped with a back panel including an evacuation zone, toward the exterior of the rack, of air having circulated over electric power components arranged within the computer rack, and a rear door in the thickness of which air cooling means is arranged. The cooling device also includes a supporting frame on which the rear door is mounted, molded to surround the air evacuation zone of the computer rack, and removable positioning means of the supporting frame against the back panel of the computer rack.

8 Claims, 3 Drawing Sheets

(56) References Cited

U.S. PATENT DOCUMENTS

| | | |
|---|---|---|
| 2009/0100848 A1* | 4/2009 | Kuriyama et al. .............. 62/132 |
| 2009/0188659 A1* | 7/2009 | Delia et al. .................... 165/239 |
| 2009/0207567 A1* | 8/2009 | Campbell et al. ............. 361/696 |
| 2009/0225513 A1* | 9/2009 | Correa et al. ................. 361/700 |
| 2009/0225514 A1* | 9/2009 | Correa et al. ................. 361/701 |
| 2010/0033931 A1* | 2/2010 | Miyazawa et al. ............ 361/696 |
| 2010/0096105 A1* | 4/2010 | Novotny et al. ............. 165/80.2 |

* cited by examiner

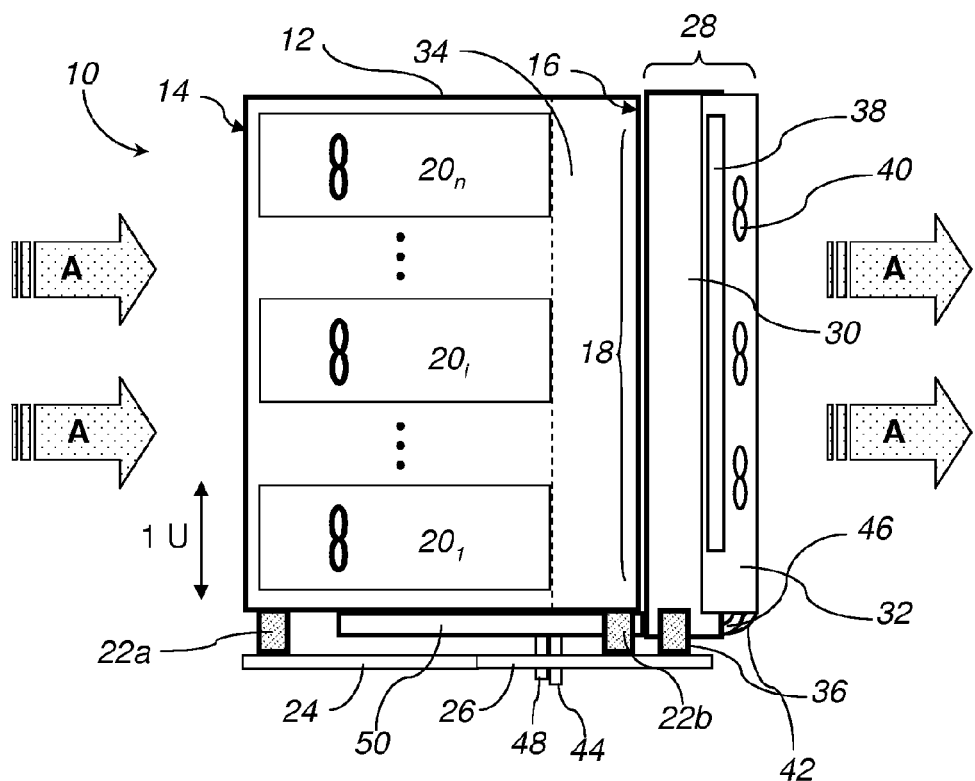
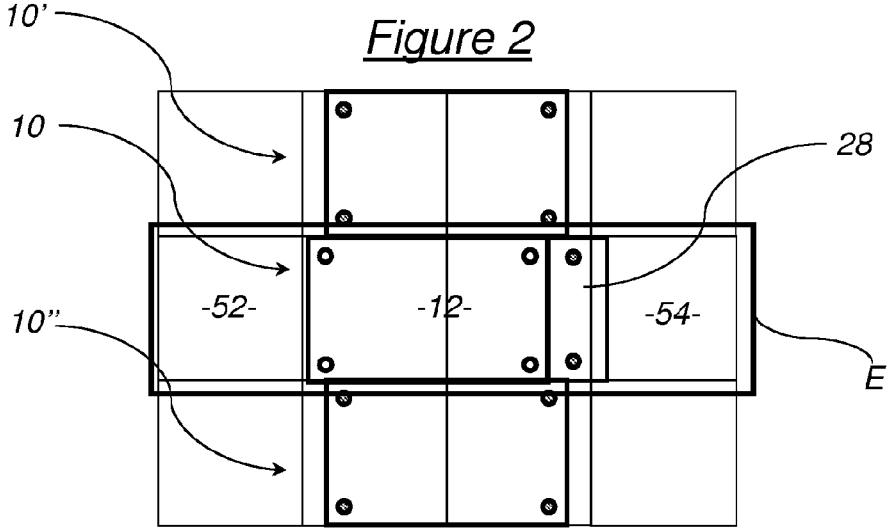

COMPUTER BAY COOLING DEVICE AND COMPUTER EQUIPMENT COMPRISING SAME

BACKGROUND

1. Field of the Invention

The present invention relates to a cooling device of a computer rack and a computer installation comprising such a device.

2. General Background

A computer rack is a hardware structure in which computer equipment is arranged (computers, storage devices, etc.), generally identified by their vertical position in the rack. The standard U unit has thus been defined by the standard EIA-310-D to define this identification in a universal manner: 1 U=44.45 mm.

The computer equipment of a rack comprises electric power components whose operation generates a dissipation of heat that must be evacuated. Although the emergence of CMOS technologies has enabled the power dissipated by components to be reduced and their capacity of integration on a single chip to be increased, the applications require in parallel ever greater computation power (database management, decision-support applications, supercomputing, Internet access, etc.).

Hence, the techniques for designing computers with Symmetric MultiProcessing architecture (SMP architecture) and the techniques for grouping computers into server clusters enable a response to this need for power to be made. It is thus possible to design HPC type computers (High Performance Computing), capable of integrating up to ten thousand basic processors at very high clock frequencies, distributed in a large number of computation servers arranged in several racks, themselves interconnected with each other in a closed and air-conditioned computer room in which attempts are still made to incorporate a maximum of servers in the three dimensions. The aim is to reach a maximum of Giga Flops (Floating-point Operations Per Second) per $m^2$ and/or the maximum of Internet connections per $m^2$.

However, at the same time, the use of increasingly refined technologies to produce transistors and the race for high frequencies has led to the increase of leakage currents of the transistors and to an explosion of power dissipated by each processor, which can now reach 185 Watts. Hence, to fill a computer room necessarily stumbles at the first limit reached among the following three: its capacity in volume, its capacity in electric power and its capacity to evacuate the heat generated.

The evacuation of heat generated by an air-conditioning of the computer room poses significant problems of costs: costs related to the electric consumption of the air-conditioning system, but also those related to its installation and maintenance.

Moreover, a computer room generally comprises a raised floor constituted by square tiles of dimensions 60 cm×60 cm, on which the computer racks are arranged and under which electrical connection cables travel. A standard computer rack has a height generally comprising 42 useful U, a width equal to that of one tile and a variable depth, but generally comprised between one and two tiles. Moreover, from a maintenance and wiring point of view, it is necessary to have access to the raised floor under the computer rack, such that the tile in front of the front panel of the rack and the one in front of its back panel must be free to access. Hence, the surface area of a computer rack necessary for a computer room is in fact four tiles, which represents the standard reference. This is why the depth of a computer rack must not exceed two tiles, any overlapping on a "maintenance" tile condemning it.

Considering the above, the maximum density ratio possible with standard hardware in a computer room is therefore 42 U/1.44 $m^2$ which gives a ratio of 29 U/$m^2$, under the hypothesis that all the space within the computer racks of the room is used. From this density ratio, it is possible to estimate the thermal dissipation ratio per room surface area, that thermally governs the cooling capacity of a room by taking into account operating criteria of the computer hardware (i.e. limit of air inlet temperature in the hardware).

One cooling solution is based on the fact that the computer equipment arranged in the rack is self-ventilated and thus cooled, owing to the air-conditioning of the computer room. The cooling circuit is therefore as follows: the cold air supplied by the air-conditioning of the room enters the rack via a front door having a certain percentage of opening, heats up by passing through the computer equipment and is expelled from the rack via a rear door in the room with a higher output temperature, sometimes by several tens of degrees according to the devices. As each item of computer equipment can only operate in a range of air inlet temperatures, the air-conditioning of the room must regulate the ambient temperature in a sufficient manner to remain within this range.

Given that an efficient air-conditioning can cool computer racks that dissipate up to 10 or 12 kW, this gives a thermal dissipation ratio of 7 to 8 kW/$m^2$. If account is taken of the actual thermal load of a server that is comprised between 750 W and 1 kW per U, a thermal dissipation ratio comprised between 7 and 10 U/$m^2$ is obtained and therefore the room, which has a theoretical capacity of 29 U/$m^2$, can cool the computer racks provided that they are filled at a rate comprised between 24 and 34%.

In other words, for a computer room to be cooled correctly by air, it must only be constituted of racks that are ⅔ or ¾ empty. Consequently, the economic yield is low in terms of surface area, in terms of wiring (length, distance), as well as in terms of power consumption of the air-conditioning system, which will further have to cover the lack of uniformity of the ambient temperature of the room if the equipment is mixed.

Another cooling solution consists in reducing the thermal problem in the space of the rack, that is to provide cooling means in the computer rack itself. This cooling means comprises for example an air/water heat exchanger. The cooling circuit is therefore as follows: the cold air supplied by the air-conditioning of the room enters the rack, heats up by passing through the computer equipment and is cooled by the air/water heat exchanger installed in the rack, the latter being capable of transferring the heat of the air to water exchanger that is injected back into a hydraulic circuit of the room and is cooled at the level of cold units. This solution is advantageous because the heat conducting property of water is around 4,000 times greater than that of air.

However, the cooling means specific to each computer rack takes up space and the choice of its location is important.

For example, a first variant consists in arranging this cooling means laterally in the rack. The disadvantage of this variant is that to integrate it in the side of the rack, the dimension of the rack must be increased in width. It then no longer corresponds to a tile in width, but to at least one tile and an additional ⅓ of a tile. If the U/$m^2$ ratio is recalculated, a reduction of 22 U/$m^2$ is observed, which gives a thermal dissipation ratio of 16.5 to 22 kW/$m^2$, less than the ratios calculated in optimum conditions.

A second variant consists in arranging this cooling means at the bottom in the rack. The disadvantage of this variant is that to integrate it in this manner, a certain height must be reserved for it and therefore reduce the vertical integration capacity of computer equipment of the rack. In the same manner as previously, if the U/m² ratio is recalculated, a reduction of 23.6 U/m² is observed, which gives a thermal dissipation ratio of 17.5 to 23.6 kW/m², still less than the ratios calculated in optimum conditions.

In fact, it appears that the best solution is to arrange this cooling means at the back of the computer rack, at the level of its rear door, in a space available owing to the fact that the computer racks have a depth less than two tiles.

The invention thus applies more particularly to a cooling device of a computer rack equipped with a back panel comprising an evacuation zone, toward the exterior of the rack, of air having circulated over electric power components arranged within this computer rack, comprising a rear door in the thickness of which air cooling means is arranged.

Such a device is described in the document published under the number US 2006/0232945. In this document, the cooling means of the computer rack comprises an air/water heat exchanger integrated in the thickness of the rear door of a computer rack. The rear door is mounted on the chassis of the computer rack. But it imposes a specific chassis different from a standard rack chassis not comprising specific cooling means. Moreover, if the rear door was also to comprise a ventilation system, it would be even heavier and/or more voluminous and a different chassis structure would also still have to be designed.

It thus appears that a rack initially designed to receive slightly dissipative hardware would have to be replaced by another rack such as the one described in the aforementioned document if the hardware it contains evolves and becomes more dissipative. Now, a computer room is led to evolve over time: to be obliged, either to modify the air-conditioning system, or to replace the computer racks according to the variation of needs, is restrictive. It is further important to be able to conserve a variety of equipment in a room without for as much harming the thermal uniformity of the room, which is not simple to provide with the aforementioned racks.

It can be advisable to provide for a computer rack cooling device that can overcome at least one part of the aforementioned problems and constraints.

SUMMARY

The purpose of the invention is therefore a cooling device of a computer rack equipped with a back panel comprising an evacuation zone, toward the exterior of the rack, of air having circulated over electric power components arranged within this computer rack, comprising a rear door in the thickness of which air cooling means is arranged, characterized in that it further comprises a supporting frame on which the rear door is mounted, molded to surround the air evacuation zone of the computer rack, and removable positioning means of the supporting frame against the back panel of the computer rack.

Hence, if a computer rack must be capable of including cooling means or to replace its cooling means by more efficient cooling means, thanks to a cooling device according to the invention that has the particularity of being interchangeable by means of its removable positioning means, it is unnecessary to replace the rack entirely: it is sufficient to remove its rear door and to position the new cooling device against its back panel. More generally, the interchangeability of the cooling devices on a same common structure of computer rack facilitates the management of the evolution of a computer room and the maintenance of a uniformity of temperature over time.

In an optional manner, the supporting frame comprises autonomous means of floor support, separate from those of the computer rack.

In this case, even if the rear door is heavy and/or unwieldy owing to the fact that it contains more powerful cooling means, it is unnecessary for all that to adapt the structure of the computer rack against which it is positioned as it is fully carried by the supporting frame via its own support means.

Also in an optional manner, the rear door is mounted pivoting on the supporting frame by means of a hinge whose vertical rotation axis is located on an exterior face of the supporting frame and the rear door, on the side of the opening of the door.

Also in an optional manner, the air cooling means arranged in the thickness of the rear door comprises at least one air/water heat exchanger.

Also in an optional manner, a cooling device according to the invention comprises first connection means to an external supply of cold water and second connection means to an external evacuation of hot water having circulated in the air/water heat exchanger, wherein:
  the first connection means comprises a flexible tube attached, at one extremity, to a connection device to the external supply and, at its other extremity, to a pivoting connection device to the air/water heat exchanger, and
  the second connection means comprises a flexible tube attached, at one extremity, to a connection device to the external evacuation and, at its other extremity, to a pivoting connection device to the air/water heat exchanger.

Also in an optional manner, the connection devices to the external supply and to the external evacuation are arranged on the supporting frame and the pivoting connection devices to the air/water heat exchanger are arranged in the rear door.

Also in an optional manner, a cooling device according to the invention further comprises a plate for receiving and guiding flexible tubes of supply and evacuation, notably a plate with at least two overlaid horizontal supports, fixed in the lower part of the supporting frame and designed to be inserted under the computer rack, between the base of the computer rack and the floor on which it is stood by means of support means.

Also in an optional manner, guiding means of the flexible tubes, notably guide pins, is arranged in the reception plate.

Also in an optional manner, the air cooling means arranged in the thickness of the rear door comprises a plurality of fans to draw the air having circulated over the electric power components toward the exterior of the computer rack.

Finally, the purpose of the invention is also a computer installation comprising a computer rack equipped with a back panel comprising an evacuation zone, toward the exterior of the rack, of air having circulated over electric power components arranged within this computer rack, and a cooling device as previously defined.

BRIEF DESCRIPTION OF THE DRAWINGS

The invention will be better understood by means of the following description, given only as an example and in reference to the attached drawings, wherein:

FIG. 1 diagrammatically represents, and in a lateral view, a computer installation according to an embodiment of the invention, FIG. 2 diagrammatically shows, and in a top view, the installation of FIG. 1, FIGS. 3a and 3b show, in a top view and in cross-section, a cooling device according to an embodiment of the invention in two different positions of a rear door.

DETAILED DESCRIPTION

Figure 3A:
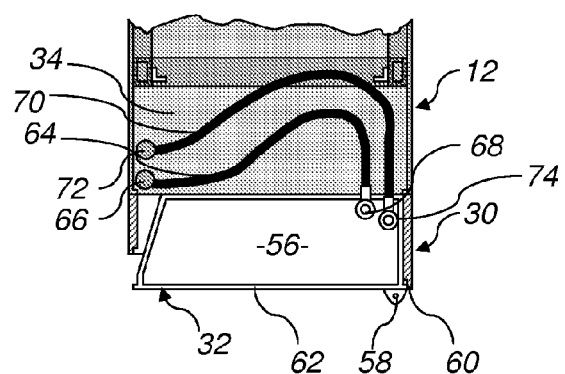

The computer installation 10 shown in FIG. 1 comprises a computer rack 12 equipped with a front panel 14 and a back panel 16. The front panel 14 comprises for example a front door (not depicted) having a certain percentage of opening. The back panel 16 comprises an evacuation zone 18, toward the exterior of computer rack 12, of a quantity of air having circulated through self-ventilated computer equipment $20_1, \ldots 20_i, \ldots, 20_n$ arranged vertically within the rack 12 and identified in position according to the standard unit U. The self-ventilated computer equipment $20_1, \ldots 20_i, \ldots, 20_n$ comprising electric power components consuming electrical power and emitting heat, such that the air heats up by crossing over them.

The computer rack 12 comprises means 22a, 22b of floor support. This support means 22a, 22b is for example four legs with jacks arranged on two tiles 24 and 26 of a computer room in which the installation 10 is found. Two front legs with jacks 22a of the computer rack 12 are arranged on the first tile 24 and two rear legs with jacks 22b of the computer rack 12 are arranged on the second tile 26.

The computer installation 10 further comprises a cooling device 28 positioned against the back panel 16 of the rack 12. This cooling device 28 further comprises a supporting frame 30 on which a rear door 32 is mounted. Air cooling means is provided for in the thickness of this rear door 32.

The supporting frame 30 is shaped to be capable of surrounding the air evacuation zone 18 in such a manner that the entire quantity of air that crosses this evacuation area 18 is directed to pass through the rear door 32 of the supporting frame 30 and to be cooled by the latter. The air cooling circuit is therefore the following, identified by the arrows A: the cold air supplied by the air-conditioning of the room enters the computer rack 12 via the front panel 14, heats up by passing through the self-ventilated computer equipment $20_1, \ldots 20_i, \ldots, 20_n$, passes through a wiring space 34 located between the rear of the computer equipment $20_1, \ldots 20_i, \ldots, 20_n$ and the evacuation zone 18, and is expelled outside of the rack 12 via the cooling device 28 in the room with an output temperature being able to be equal to the input temperature in the rack 12, which makes the latter thermally transparent. The savings made in air-conditioning for the computer room are consequently very noticeable.

The supporting frame 30 comprises removable positioning means against the back panel 16 of the computer rack 12. In a standard manner, these removable positioning means can comprise means (not depicted) for adjusting the exact position of the supporting frame 30 against the back panel 16 of the computer rack 12: this adjustment means is for example relief forms arranged on the supporting frame 30 and being positioned opposite corresponding relief forms arranged on the back panel 16 of the computer rack 12. They can further comprise a folded back edge intended to surround the exterior edge of the back panel 16 of the rack 12. They are possibly associated with standard removable attachment means (screw systems, clip-on features, etc.) to ensure the support of the supporting frame 30 against the back panel 16.

Moreover, the removable positioning means of the supporting frame 30 can comprise autonomous means 36 of floor support, such as for example two legs with jacks, separate from those of the computer rack 12 and intended to be arranged on the second tile 26, in the available space left between the back panel 16 of the rack 12 and the free extremity of the second tile 26.

In a general manner, the removable positioning means allows the cooling device 28 to be interchangeable on the computer rack 12, that is to be able to be positioned easily against the back panel 16 and easily removed. The computer rack 12 can thus be a standard rack against which a specific independent and interchangeable cooling device is positioned.

When this removable positioning means comprises the legs with jacks 36, this further enables the supporting frame 30 to fully support the weight of the rear door 32 and accordingly lighten the load supported by the computer rack 12. As it is moreover possible to arrange these legs with jacks 36 on the second tile 26, the overall space required for the computer installation 10 remains the same.

The air cooling means provided for in the thickness of the rear door 32 comprises for example an air/water heat exchanger 38, and fans 40 distributed over the surface of the rear door 32 to draw the quantity of air having circulated over the electric power components of the computer rack 12 toward the exterior of the latter.

For the correct operation of this air cooling means, the cooling device 28 further comprises first connection means 42 of the air/water heat exchanger 38 to an external supply 44 of cold water and second connection means 46 of the air/water heat exchanger 38 to an external evacuation 48 of hot water having circulated in this air/water heat exchanger.

As the air/water heat exchanger 38 is arranged in the rear door 32 that is mobile, while the external power supply 44 and the external evacuation 48 are fixed and connected to the floor, the connection means 42 and 46 advantageously provide for the use of flexible tubes. To prevent that these flexible tubes are not damaged or crushed during the opening or closing of the rear door 32, the cooling device 28 shown in FIG. 1 further comprises a plate 50 for receiving and guiding flexible tubes of supply and evacuation, fixed in the lower part of the supporting frame 30 and designed to be inserted under the computer rack 12, between the base of the computer rack and the floor, that is the tiles 24 and 26, on which it is stood by means of the legs with jacks 22a and 22b. This reception and guide plate 50 will be described with reference to FIGS. 5 and 6.

FIG. 2 illustrates the overall space required for the computer installation 10. As this has been indicated beforehand, the computer rack 12 has a width corresponding to the width of one tile and a depth less than two tiles. It has been seen that the cooling device 28 described previously does not add any space required in depth to the computer installation 10, owing to the fact that the legs with jacks 36 of its supporting frame 30 can be positioned on the second tile 26. Nor does it add any space required in width, in such a manner that the overall space required E of the computer installation 10 remains four tiles: two position tiles 24, 26 and two maintenance tiles 52 and 54.

This required space E is the same as the one of the two other computer installations 10' and 10" shown in FIG. 2, that are not however equipped with the cooling device 28. Moreover, the cooling device 28 does not take up the interior space of the computer rack 12, such that the latter always has a capacity of 42 useful U only dedicated to the reception of computer equipment.

As it can also been noted on this FIG. 2, the computer installations 10, 10', 10" are arranged side by side in the computer room. Despite this positioning, the rear door 32 of the cooling device 28 of the computer installation 10 must always be open at 180° to allow the maintenance of the computer equipment integrated into the rack 12 and the access to the cabling space 34. It must not however collide with the adjoining installation.

Figure 3B:
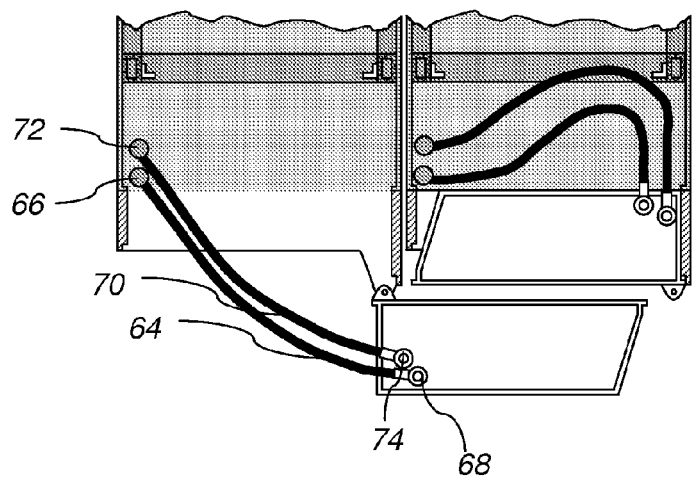

This is why an offset hinge system can be used, as shown in FIG. 3a in closed position of the rear door 32 and on the FIG. 3b in open position of the rear door 32.

FIG. 3a partially represents the computer installation 10 in its rear part, from a top view. In this figure, the supporting frame 30 is positioned against the back panel 16 of the computer rack 12. The rear door 32 is in the closed position and its interior volume 56 containing the cooling means is fully housed in the interior volume of the supporting frame 30: to do this, the free extremity of the rear door 32 is advantageously beveled in its thickness.

The rear door 32 is mounted pivoting on the supporting frame 30 by means of a hinge 58 for which the vertical rotation axis is located on an exterior face 60 of the supporting frame 30 corresponding to an exterior face 62 of the rear door 32. These exterior faces 60 and 62 are arranged on the side of the opening of the rear door 32.

In this FIG. 3a, the connection means 42 and 46 of the air/water heat exchanger 38 are also shown.

The first connection means 42 to the external supply 44 of cold water comprises a first flexible tube 64 attached, at one extremity, to a connection device 66 to the external supply 44 located in the wiring space 34 and, at its other extremity, to a connection device 68 to the air/water heat exchanger 38 located in the rear door 32.

The second connection means 46 to the external evacuation 48 of hot water comprises a second flexible tube 70 attached, at one extremity, to a connection device 72 to the external evacuation 48 located in the wiring space 34 and, at its other extremity, to a connection device 74 to the air/water heat exchanger 38 located in the rear door 32.

In an optional manner, the connection devices 68 and 74 are connected to the air/water heat exchanger 38 by means of a standard multiple-way valve (not depicted), for example a three-way valve, to regulate the supply of cold water and therefore to regulate the cooling means.

In FIG. 3b, the rear door 32 is shown in the open position at 180°. Owing to the offset hinge system, its opening is not hindered by the adjoining installation.

It is also noted that in this FIG. 3b, the position of the flexible tubes 64 and 70 is not the same as in the FIG. 3a. They are taut, owing to the 180° opening of the rear door 32. This is why a pivot system is preferentially used for the connection devices 68 and 74, and also possibly for the connection devices 66 and 72.

Figure 4:
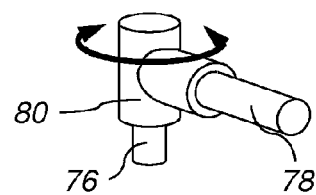
FIG. 4 is a perspective view of a pivoting connection device implemented in the device of FIGS. 3a and 3b.

This pivot system is shown in FIG. 4. According to this system, a first rigid tube 76 is connected to a second flexible tube 78 by using a connection junction 80 in the shape of a T of which the upper branch is mounted coaxially on the first rigid tube 76. Hence, the pivot system of the connection devices 66, 68, 72 and 74 adapts to the movement of the flexible tubes 64 and 70 during the opening and closing of the rear door 32.

Moreover, the dimension of the flexible tubes 64 and 70 is calculated according to the length necessary when the rear door 32 is completely open at 180°. Hence, when the rear door 32 is closed, the space required for the flexible hoses 64 and 70 poses a problem. Moreover, their diameter gives them a large radius of curvature. It is therefore interesting to consider guiding their movement during the opening or the closing of the rear door 32. This is the function of the reception and guide plate 50 shown on the FIGS. 5 and 6 in a particular embodiment of the invention.

Figure 5:
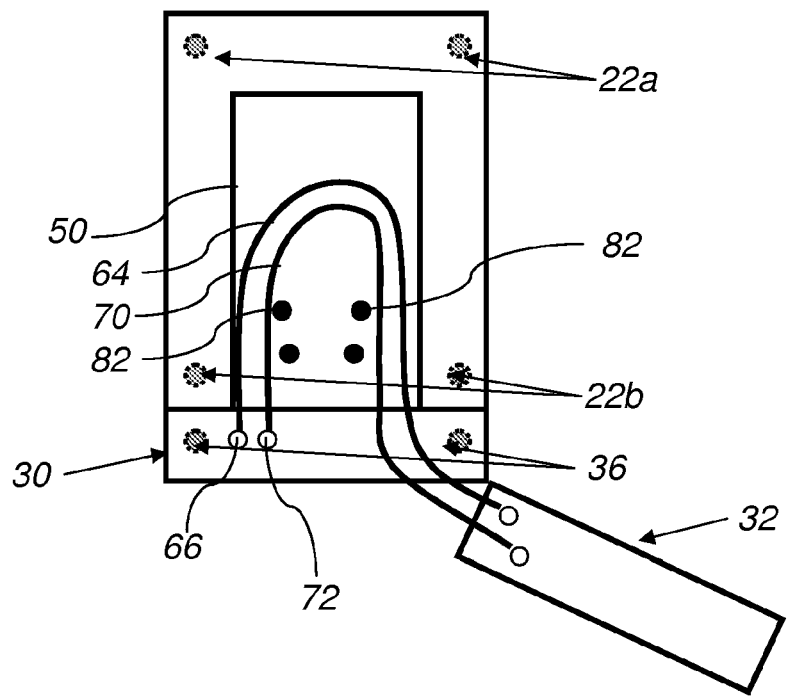
FIG. 5 shows, in a top view and in cross-section, a cooling device according to another embodiment of the invention.

As shown in FIG. 5, the reception and guide plate 50 is fixed at the lower part of the supporting frame 30 and is completely integrated, in the space occupied by the computer rack 12, between the latter and the floor. As a variant, the reception and guide plate 50 could be attached to the computer rack 12.

It is in this plate 50 that the flexible tubes 64 and 70 are housed. In an optional manner, the plate 50 is equipped with means 82 for guiding the flexible tubes 64 and 70 that constrain the deformations and movements of these flexible tubes. This guiding means 82 can take the form of guide pins.

It will also be noted that in the embodiment illustrated in FIG. 5, the connection devices 66 and 72 are arranged around the supporting frame 30 instead of being arranged in the wiring space 34, which improves the autonomy of the cooling device 28.

Figure 6:
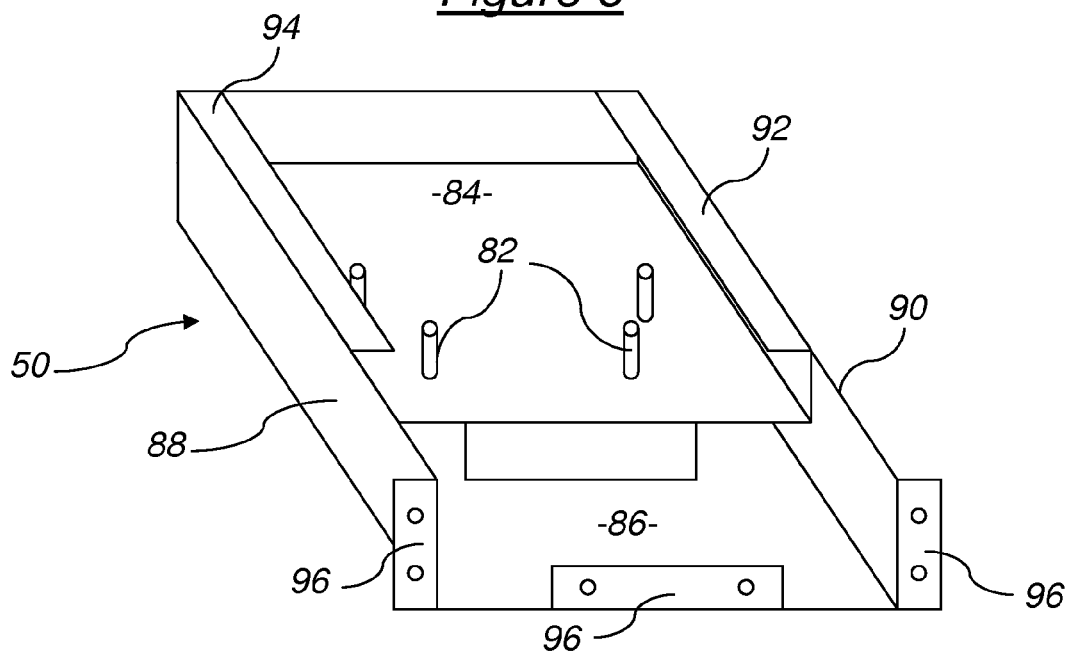
FIG. 6 is a perspective view of a reception and guide plate implemented in the device of FIG. 5.

The reception and guide plate 50 is shown diagrammatically in perspective in FIG. 6. In an embodiment of the invention, it comprises two overlaid horizontal supports 84 and 86, the one (84 or 86) to receive the first flexible tube 64, the other (86 or 84) to receive the second flexible tube 70. Hence, the two flexible tubes do not hinder each other during their respective deformations. Four guide pins 82 are shown on the upper horizontal support 84. Likewise, four guide pins 82, not visible on this figure, can be provided for on the lower horizontal support 86.

Moreover, the channels realized by the vertical lateral edges 88, 90 of the plate 50 and to upper flaps 92, 94 of these lateral edges oblige the flexible tubes 64 and 70 to roll up naturally.

Finally, it will be noted that this reception and guide plate 50 is equipped with attachment means 96 to the supporting frame 30, for example by screwing.

It clearly appears that a cooling device of a computer rack 12 as described above enables it to be made interchangeable and to be positioned against standard computer racks without any particular constraint upon the latter.

Moreover, although this cooling device can comprise an air/water heat exchanger, an array of fans, a multiple-way supply valve, flexible tubes, the overall space required of the computer installation comprising such a cooling device is not increased and the composition of the cooling device has no influence on the structure of the computer rack that receives it.

Thanks to this cooling device, it is not only possible to obtain a maximum density ratio for computer equipment of 29 U/m$^2$, but also to evacuate up to 40 kW thanks to the air/water heat exchanger. This solution is therefore optimum in terms of occupation of the computer room and efficiency/cooling costs.

Finally, thanks to the interchangeability of the cooling devices of the computer racks in the computer room, this enables a great flexibility in the possible developments of the computer equipment of this room.

The invention claimed is:

1. A cooling device of a computer rack equipped with a back panel comprising an evacuation zone, toward an exterior of the computer rack, of air having circulated over electric power components ($20_1, \ldots, 20_i, \ldots, 20_n$) arranged within the computer rack, comprising a rear door in the thickness of which air cooling means with at least one air/water heat exchanger is arranged, the cooling device comprising:
 a supporting frame on which the rear door is mounted, the supporting frame being shaped to surround the air evacuation zone of the computer rack;

removable positioning means of the supporting frame disposed against the back panel of the computer rack;
first connection means to an external supply of cold water;
second connection means to an external evacuation of hot water having circulated in the air/water heat exchanger; and
a plate for receiving and guiding flexible tubes of supply and evacuation including a plate with at least two overlaid horizontal supports fixed in a lower part of the supporting frame and constructed to be inserted under the computer rack at a location between the base of the computer rack and the floor on which of the computer rack is supported using floor support means,
wherein the first connection means comprises a flexible tube attached, at one extremity, to a connection device to the external supply and, at another extremity, to a pivoting connection device to the air/water heat exchanger, and
wherein the second connection means comprises a flexible tube attached, at one extremity, to a connection device to the external evacuation and, at another extremity, to a pivoting connection device to the air/water heat exchanger.

2. The cooling device according to claim 1, wherein the rear door is pivotally mounted on the supporting frame using a hinge whose vertical rotation axis is located on an exterior face of the supporting frame and the rear door and on the side of an opening of the rear door.

3. The cooling device according to claim 1,
wherein the connection devices to the external supply and to the external evacuation are arranged on the supporting frame and the pivoting connection devices to the air/water heat exchanger are arranged in the rear door.

4. The cooling device according to claim 1, wherein guiding means of the flexible tubes, said guiding means comprising guide pins, is arranged in the reception plate.

5. The cooling device according to claim 1, wherein the air cooling means arranged in the thickness of the rear door further comprises:
a plurality of fans configured to draw air which has circulated over the electric power components ($20_1, \ldots, 20_i, \ldots, 20_n$) toward the exterior of the computer rack.

6. A computer installation comprising:
a computer rack equipped with a back panel comprising an evacuation zone disposed toward an exterior of the computer rack, for air which has circulated over electric power components ($20_1, \ldots, 20_i, \ldots, 20_n$) arranged within said computer rack; and
a cooling device comprising
a supporting frame on which a rear door is mounted, said supporting frame being shaped to surround the air evacuation zone of the computer rack;
removable positioning means of the supporting frame disposed against the back panel of the computer rack;
air cooling means arranged in a thickness of said rear door, said air cooling means including at least one air/water heat exchanger;
first connection means to an external supply of cold water;
second connection means to an external evacuation of hot water having circulated in said at least one air/water heat exchanger; and
a plate for receiving and guiding flexible tubes of supply and evacuation including a plate with at least two overlaid horizontal supports fixed in a lower part of the supporting frame and constructed to be inserted under the computer rack at a location between the base of the computer rack and the floor on which of the computer rack is supported using floor support means,
wherein the first connection means comprises a flexible tube attached, at one extremity, to a connection device to the external supply and, at another extremity, to a pivoting connection device to the at least one air/water heat exchanger, and
wherein the second connection means comprises a flexible tube attached, at one extremity o a connection device to the external evacuation and, at another extremity, to a pivoting connection device to the at least one air/water heat exchanger.

7. The computer installation according to claim 6, further comprising:
wherein the supporting frame comprises autonomous means of floor support for said rear door, separate from floor support means of the computer rack, and which supports said rear door independently from said floor support means of the computer rack.

8. The cooling device according to claim 1, further comprising:
wherein the supporting frame comprises autonomous means of floor support for said rear door, separate from floor support means of the computer rack, and which supports said rear door independently from said floor support means of the computer rack.

* * * * *